United States Patent
Yoon et al.

(10) Patent No.: US 7,056,781 B2
(45) Date of Patent: Jun. 6, 2006

(54) METHOD OF FORMING FIN FIELD EFFECT TRANSISTOR

(75) Inventors: Jae-Man Yoon, Seoul (KR); Gyo-Young Jin, Seoul (KR); Hee-Soo Kang, Gyeonggi-do (KR); Dong-Gun Park, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/014,212

(22) Filed: Dec. 15, 2004

(65) Prior Publication Data

US 2005/0153490 A1    Jul. 14, 2005

(30) Foreign Application Priority Data

Dec. 16, 2003    (KR)    .................... 10-2003-0091716

(51) Int. Cl.
*H01L 21/336*    (2006.01)
(52) U.S. Cl. ...................... 438/197; 438/592
(58) Field of Classification Search .................... 438/6, 438/10, 104, 107–114, 118, 121–123, 128–129, 438/135, 142, 145, 149, 151, 157, 176, 178, 438/184, 193, 195–203, 206, 207, 209–211, 438/218, 237, 265, 294, 308, 337, 353
See application file for complete search history.

(56) References Cited

U.S. PATENT DOCUMENTS

| | | | |
|---|---|---|---|
| 6,417,047 B1 | 7/2002 | Isobe | |
| 6,548,859 B1 | 4/2003 | Maegawa | |
| 6,642,090 B1 | 11/2003 | Fried et al. | |
| 6,846,734 B1 * | 1/2005 | Amos et al. | ................. 438/592 |
| 6,855,588 B1 * | 2/2005 | Liao et al. | ................. 438/197 |
| 2003/0122186 A1 | 7/2003 | Sekigawa et al. | |

OTHER PUBLICATIONS

Park et al., "A 40nm Body-Tied FinFET (OMEGA MOSFET) using Bulk Si Wafer" Physica E, vol. 19, Issues 1-2, pp. 6-12 (Jul. 2003).

* cited by examiner

*Primary Examiner*—Michael Lebentritt
*Assistant Examiner*—Andre' Stevenson
(74) *Attorney, Agent, or Firm*—Marger Johnson & McCollom, P.C.

(57) ABSTRACT

According to some embodiments, a fin type active region is formed under an exposure state of sidewalls on a semiconductor substrate. A gate insulation layer is formed on an upper part of the active region and on the sidewalls, and a device isolation film surrounds the active region to an upper height of the active region. The sidewalls are partially exposed by an opening part formed on the device isolation film. The opening part is filled with a conductive layer that partially covers the upper part of the active region, forming a gate electrode. Source and drain regions are on a portion of the active region where the gate electrode is not. The gate electrode may be easily separated and problems causable by etch by-product can be substantially reduced, and a leakage current of channel region and an electric field concentration onto an edge portion can be prevented.

26 Claims, 13 Drawing Sheets

FIG. 16a
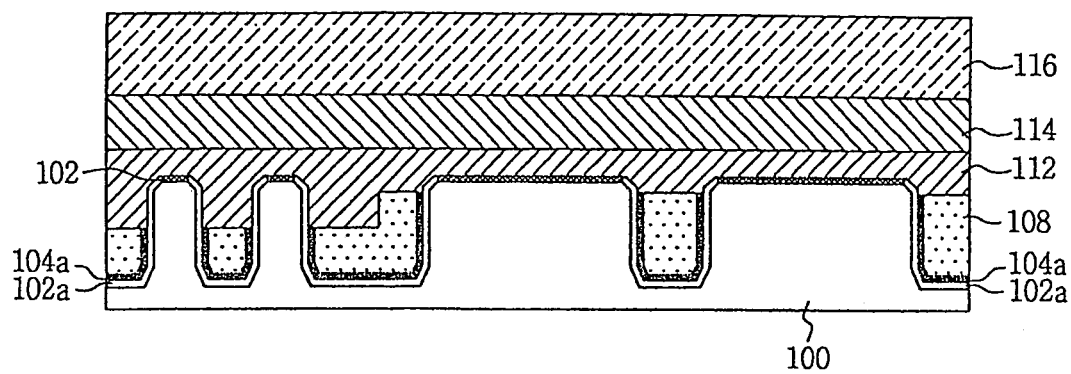
FIG. 16b
FIG. 16c
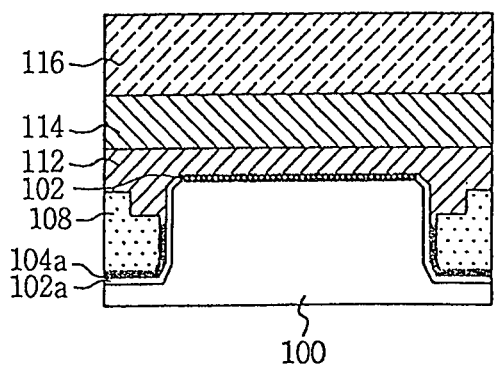
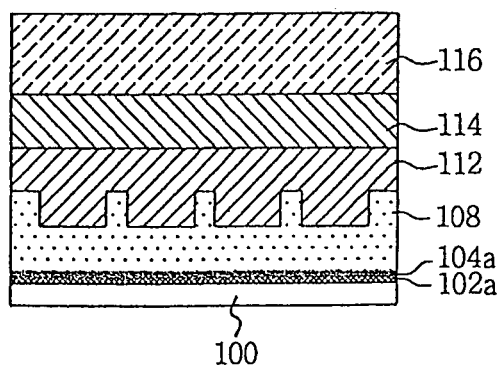

FIG. 17a
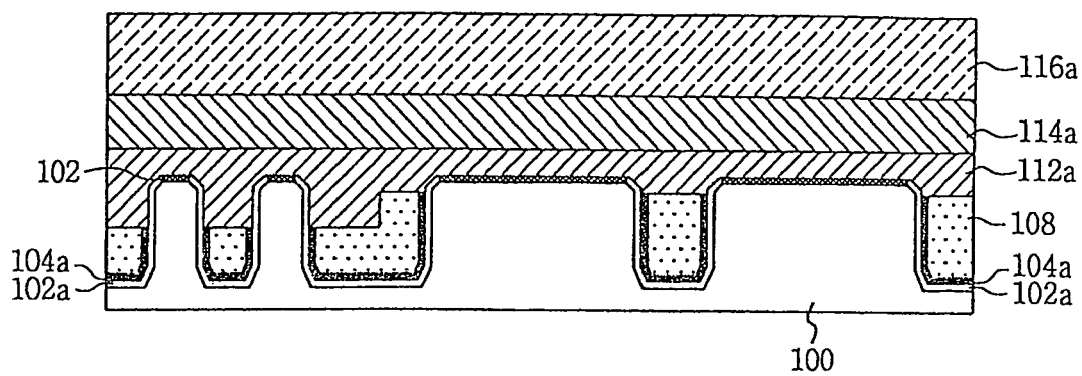
FIG. 17b
FIG. 17c
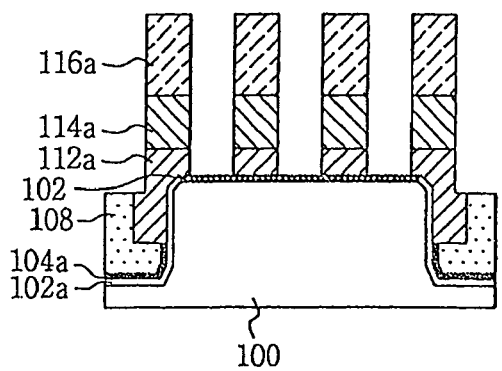
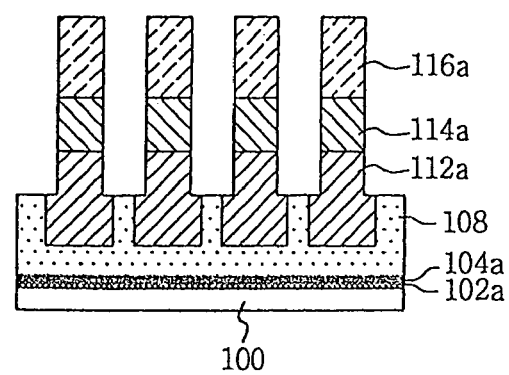

METHOD OF FORMING FIN FIELD EFFECT TRANSISTOR

CROSS REFERENCE TO RELATED APPLICATIONS

This application claims priority from Korean Patent Application No. 2003-91716, filed on Dec. 16, 2003, the content of which is hereby incorporated by reference for all purposes.

BACKGROUND OF THE INVENTION

1. Field of the Invention

This disclosure relates to a method of forming a semiconductor device, and more particularly, to a method of forming a fin field effect transistor (finFET) by using a damascene method.

2. Description of the Related Art

Metal-oxide-semiconductor field effect transistor (MOSFET) is gradually miniaturized for high performance and high integration. To enhance the integration degree of device a new technique has been proposed continuously and this brings about a production of prominent devices from the viewpoint of operation or size.

As one technique to enhance the integration degree of device, a fin field effect transistor was proposed. Such a transistor is formed by a vertical structure of body region, and the name is derived from a similarity to a fish's dorsal fin.

The finFET has a powerful advantage in that much more current can be controlled without increasing the size of device. However, one disadvantage is that it is difficult to electrically isolate individual finFETs. To solve the disadvantages of finFETs, the finFET has been conventionally manufactured from an SOI (Silicon-On-Insulator) substrate. Particularly, fins of the transistor have been formed from a silicon layer provided on an upper part of buried oxide (BOX) layer. Thus, respective fins have an electrically isolated structure by the buried oxide layer existing under the fins.

However, forming the finFET from the SOI substrate is not ideal either. The cost of the SOI substrate is remarkably high as compared with a bulk substrate and the SOI substrate is not compatible with other existing manufacturing process techniques.

Thus, methods for developing finFETs from a bulk substrate have been proposed, and this has advantage of a high compatibility with existing flat type semiconductor techniques.

One example of a conventional technique for a method of forming the fin FET on a bulk substrate is found in U.S. Pat. No. 6,642,090 to Fried et al.

Another example of a conventional technique for forming a finFET from a bulk substrate is disclosed in the article "A 40 nm body-tied FinFET(OMEGA MOSFET) using bulk Si wafer", which was announced in the Fourth International Symposium on Nanostructures and Mesoscopic Systems held on Feb. 17 through Feb. 21, 2003, in U.S.A, under the title for the collection of learned papers as "Low-dimensional Systems and Nanostructures", by a writer of Elsevier B. V. in the collection of learned papers as 'Physica E, Volume 19, Issues 1–2, Pages 6–12 (July 2003)'.

The conventional techniques provide a method of forming the finFET on the bulk substrate, but do not provide a method of overcoming a side effect caused in forming an upper edge portion of the fin in a sharpened shape. Furthermore, in forming a gate electrode, an etching process is performed entirely for a device isolation film surrounding the fin so as to expose a predetermined portion of active region having a shape of the fin, and then a conductive layer is deposited. Subsequently, the conductive layer is etched by a predetermined pattern to form a gate electrode. In forming the gate electrode, an absolute etching amount increases, and furthermore, causes a short between the formed gate electrodes. There also is a problem that an etching byproduct forms a space in the gate electrode by the increase of etching amount. After forming the gate electrode, an insulation layer is formed in a device isolation region, thus the process is complicated.

Embodiments of the invention address these and other disadvantages of the conventional art.

SUMMARY OF THE INVENTION

Some embodiments of the invention provide a method of forming a finFET that may prevent or substantially reduce a leakage current in a channel region and a short of gate electrode and by which an electrode separation may be easily performed. The method reduces an etching amount in the separation of the gate electrode and achieves process simplification.

BRIEF DESCRIPTION OF THE DRAWINGS

The above and other features of exemplary embodiments of the invention will become readily apparent from the following description when reference is made to the attached drawings.

FIGS. 12–17 are cross-sectional diagrams illustrating more exemplary processes for manufacturing the finFETs of FIG. 1 according to some embodiments of the invention.

DETAILED DESCRIPTION OF THE INVENTION

Exemplary embodiments of the invention are more fully described in detail with reference to the accompanied drawings. The invention may be embodied in many different forms and should not be construed as being limited to the exemplary embodiments set forth herein. Rather, these exemplary embodiments are provided so that this disclosure is thorough and complete, and to convey the inventive concepts to those skilled in the art.

Figure 1:
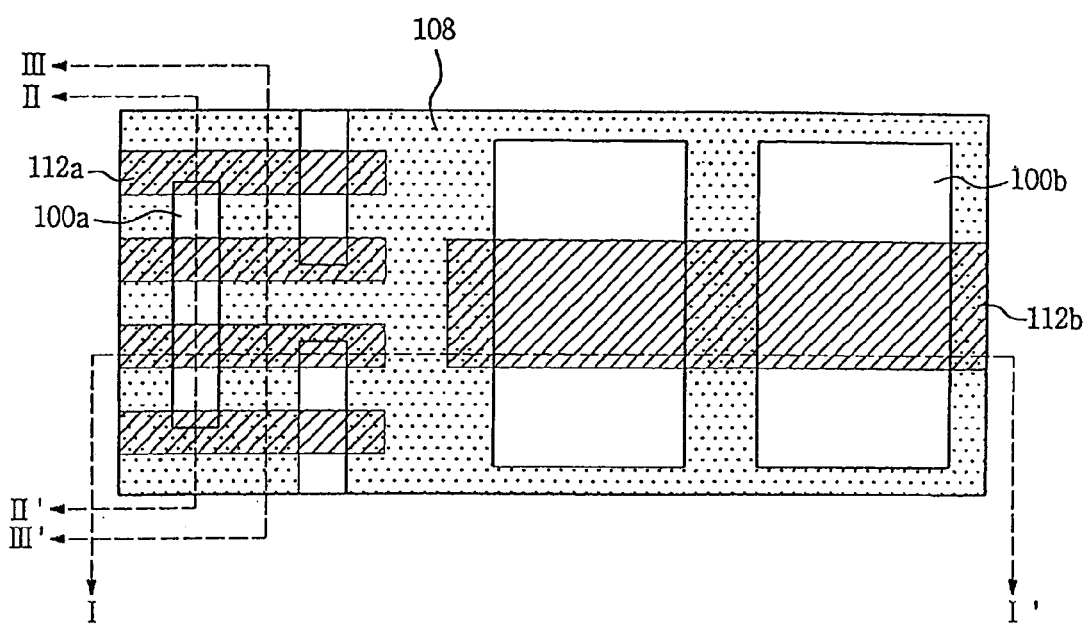
FIG. 1 is a plan diagram illustrating finFETs according to some embodiments of the invention.

FIG. 1 is a plan diagram illustrating a finFET according to some embodiments of the invention, and illustrates an active region formed in cell area and peripheral area and a gate electrode.

Referring to FIG. 1, gate electrodes 112a disposed on active regions 110a are found in a cell area, and a gate electrode 112b disposed on active regions 100b are found in a peripheral area. The active regions 100a and the gate electrodes 112a in the cell area are positioned on the left of the drawing with a relatively small size, and the active regions 100b and the gate electrode 112b in the peripheral area are positioned on the right of the drawing with a relatively large size.

FIGS. 2 to 11 are cross-sectional diagrams taken along the line I–I' of FIG. 1 that illustrate some exemplary processes for manufacturing the finFETs of FIG. 1 according to some embodiments of the invention.

Figure 2:
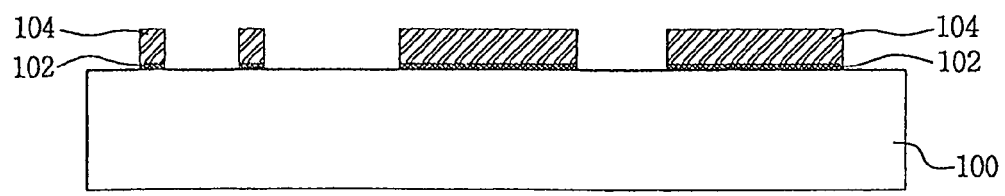
FIGS. 2 through 11 are cross-sectional diagrams illustrating some exemplary processes for manufacturing the finFETs of FIG. 1 according to some embodiments of the invention.

With reference to FIG. 2, a bulk semiconductor substrate 100 is provided, and a first oxide layer 102 is formed on the bulk semiconductor substrate 100. Then, a first insulation layer is formed on the first oxide layer 102. The first oxide layer 102 is preferably formed to a thickness of about 100 Å, and the first insulation layer may be formed by depositing an SiN layer through LPCVD (Low Pressure Chemical Vapor Deposition) or PECVD (Plasma Enhanced Chemical Vapor Deposition), etc.

A first photoresist pattern (not shown) for forming a fin as an active region is formed on the semiconductor substrate on which the first insulation layer was formed. The first insulation layer is etched until the first oxide layer 102 is exposed, by using the first photoresist pattern as a mask, to thus form a mask pattern.

Figure 3:
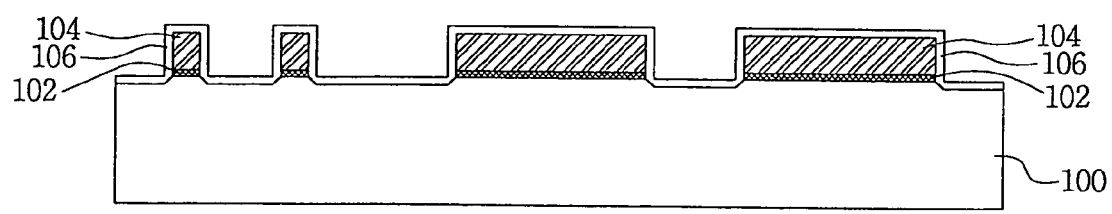

As shown in FIG. 3, an exposed portion of the first oxide layer 102 is removed, and a second oxide layer 106 is formed on an entire face of the semiconductor substrate on which the mask pattern 104 was formed. The second oxide layer 106 is formed through a recently developed ISSG (in-situ steam generation) method. By using the ISSG, silicon dioxide grows not only on silicon but also on silicon nitride. A quality of oxide through the ISSG method is better than CVD (Chemical Vapor Deposition) oxide. The ISSG method is performed within a chamber having temperature of about 900°° C. about 1100° C. and pressure of about 1000 Pa~about 2000 Pa, into which oxygen added with hydrogen of about 0.5%~33% is directly induced; and employs an exothermic oxidation of internal combustion for generating vapor from the induced hydrogen and oxygen. A surface of the semiconductor substrate 100 and upper part and side face of the mask pattern are oxidized. The second oxide layer 106 is formed to about 150 Å on the surface of semiconductor substrate, and is formed to about 100 Å on an upper part of the mask pattern 104.

Thus, the upper part of semiconductor substrate 100 adjacent to the lower part of the mask pattern 104 becomes rounded in shape. This rounded portion corresponds to the upper edge portion of a fin type active region formed in a subsequent process. The rounding-processed upper edge portion of active region prevents a leakage current caused in case of a low threshold voltage, and prevents a defect due to electric fields being overly concentrated onto the edge portion. This rounding process solves several problems caused by forming the edge portion in a pointed shape.

Figure 4:
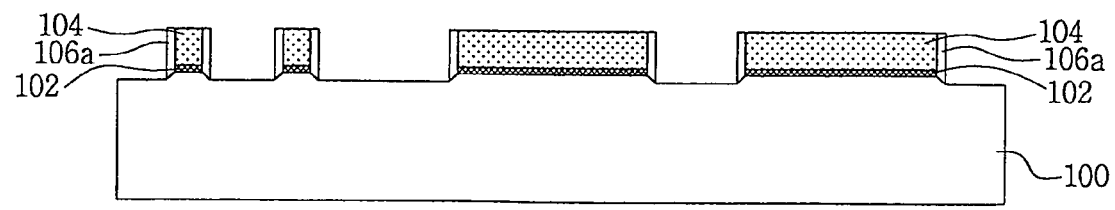

With reference to FIG. 4, the second oxide layer 106 provided on the surface of semiconductor substrate 100 and on an upper part of the mask pattern 104 is removed through an anisotropic etching process. The anisotropic etching process may employ a dry etching or plasma etching, etc.

A second oxide layer 106a formed on a side wall of the mask pattern 104 is not removed through the anisotropic etching process, and remains as a spacer in the mask pattern 104, so as to protect the rounded portion of the substrate 100 processed through the ISSG method.

Figure 5:
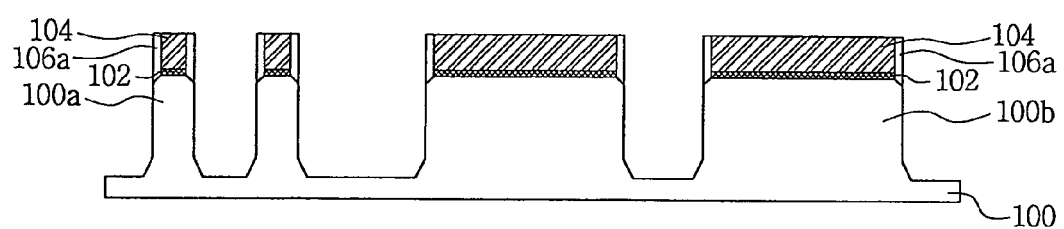

Referring to FIG. 5, the semiconductor substrate is etched by using the mask pattern 104 and the second oxide layer 106a of spacer type as an etch mask, to form fin type active regions 100a and 100b. The active region 100a and 100b are formed to have a height of between about 2000 Å to 3000 Å, and preferably the height is about 2700 Å. The etching process used to form the active regions 100a and 100b may employ a dry etching as the anisotropic etching process, etc.

Figure 6:
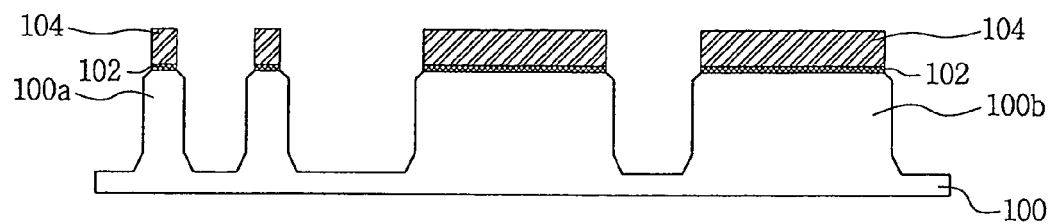

In FIG. 6, the spacer-type second oxide layer 106a formed on the side wall of the mask pattern 104 is removed through an isotropic etching process. The etching process may employ a wet etching as the isotropic etching process.

The rounded upper edge portion of active region 100a and 100b is exposed by the etching process that removes the spacer type second oxide layer 106a.

Figure 7:
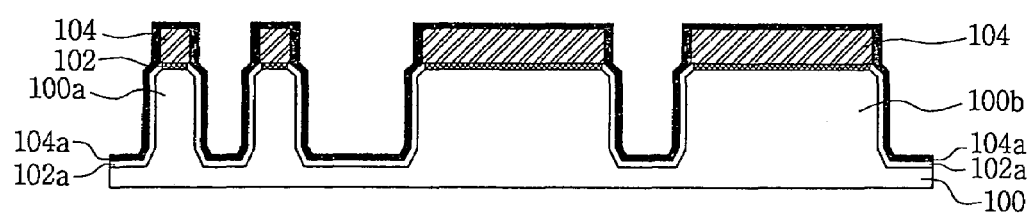

As shown in FIG. 7, a third oxide layer 102a is formed on an exposed surface of the semiconductor substrate. The third oxide layer 102a is formed to a thickness of about 50 Å. A nitride layer liner 104a is formed on the third oxide layer 102a and on the mask pattern 104. The nitride layer liner 104a may be formed up to a thickness of about 75 Å by using deposition methods such as LPCVD (Low Pressure Chemical Vapor Deposition), PECVD (Plasma Enhanced Chemical Vapor Deposition), etc.

The nitride layer liner 104a is provided to protect the active regions 100a and 100b in the active region isolation process.

Figure 8:
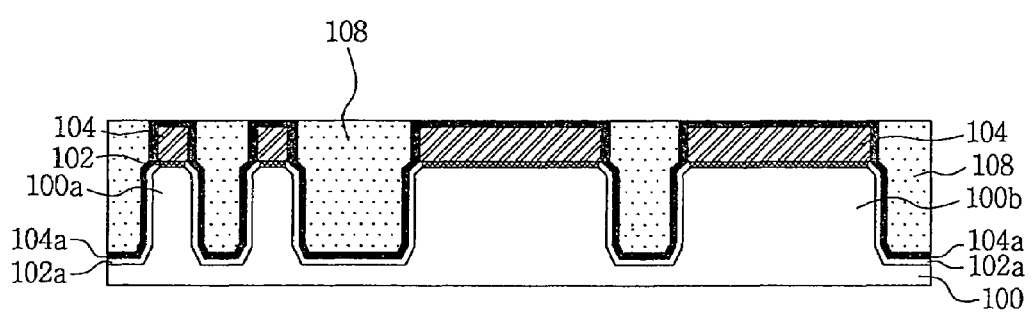

In FIG. 8, a device isolation film 108 is formed over the semiconductor substrate where the nitride layer liner 104a was formed. The device isolation film 108 fills the regions that separate the active regions 100a and 100b. The device isolation film 108 may be formed with an oxide deposition process using a high density plasma to a thickness of about 5000 Å, which is thick enough to cover the semiconductor substrate. Then, a polishing process such as CMP (Chemical Mechanical Polishing) is performed for the isolation film 108 by using the mask pattern 104 formed on the upper part of the active regions 100a, 100b as a polishing stop layer. The device isolation film 108 is formed to electrically isolate the active regions 100a, 100b.

Figure 9:
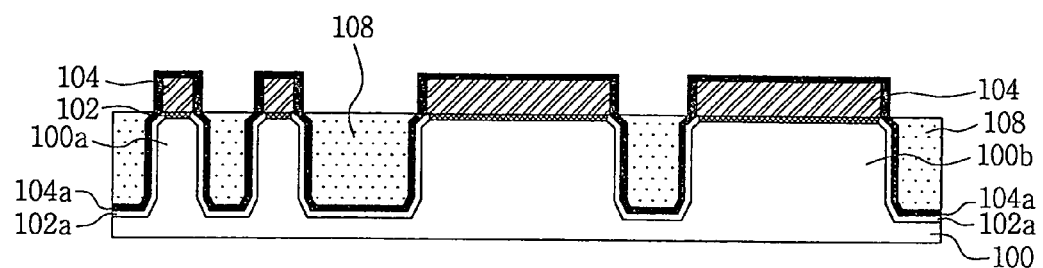

Referring to FIG. 9, the device isolation film 108 may be wet etched so that an upper height of the device isolation film 108 equals an upper height of the active region 100a and 100b. That is, the device isolation film 108 that is first formed to an upper height of the mask pattern 104 may be wet etched, by about 400 Å, thereby resulting in the device isolation film 108 of FIG. 9.

Figure 10:
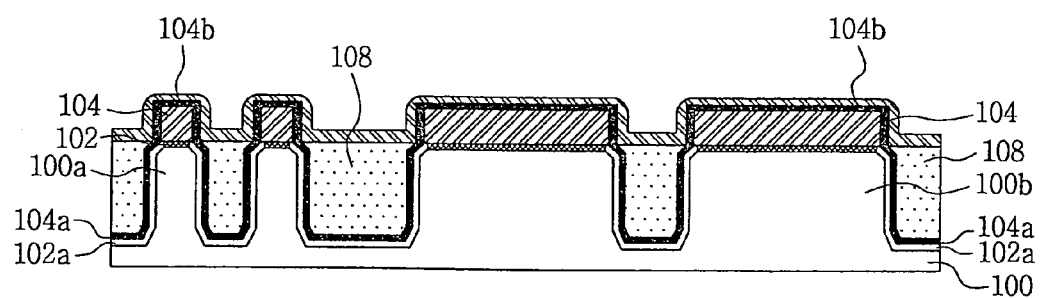

As shown in FIG. 10, a second insulation layer 104b is formed on the resultant structure of FIG. 9. The second insulation layer 104b may be formed by depositing a nitride layer to a thickness of about 200 Å, using LPCVD, PECVD, etc.

Figure 11:
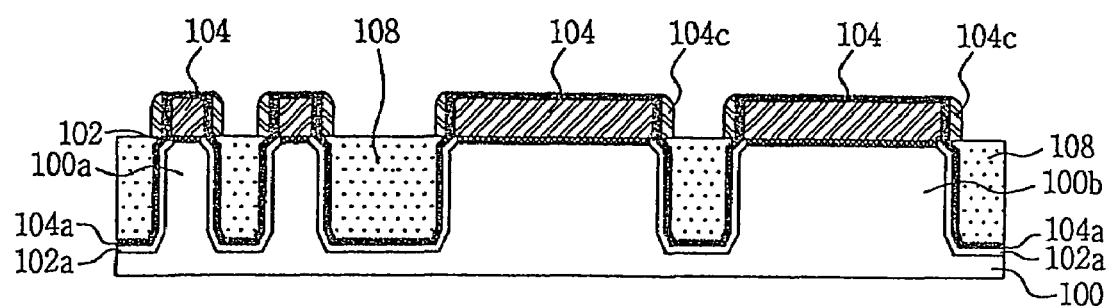

With reference to FIG. 11, the second insulation layer 104b is removed from upper parts of the device isolation film 108 and the nitride layer liner 104a. A portion of the second insulation layer 104b remains on a sidewall of the mask pattern 104. Thus, a spacer 104c is formed on the upper edge portion of the active region. The spacer 104c protects the rounded edge portion of active region 100a and 100b from being damaged in subsequent processes. The spacer 104c may be formed by an etch back process.

By the above-described processes, the active region 100a and 100b and the device isolation film 108 are formed on the cell area and on the peripheral area, as illustrated in FIG. 1.

FIGS. 12–17 are cross-sectional diagrams that illustrate some exemplary processes for manufacturing the finFETs of FIG. 1 according to other embodiments of the invention. FIGS. 12a, 13a, 14a, 15a, 16a, and 17a are cross-sectional diagrams taken along the line I–I' of FIG. 1. FIGS. 12b, 13b, 14b, 15b, 16b, and 17b are cross-sectional diagrams taken along the line II–II' of FIG. 1. FIGS. 12c, 13c, 14c, 15c, 16c, and 17c are cross-sectional diagrams taken along the line III–III' of FIG. 1.

Figure 12A:
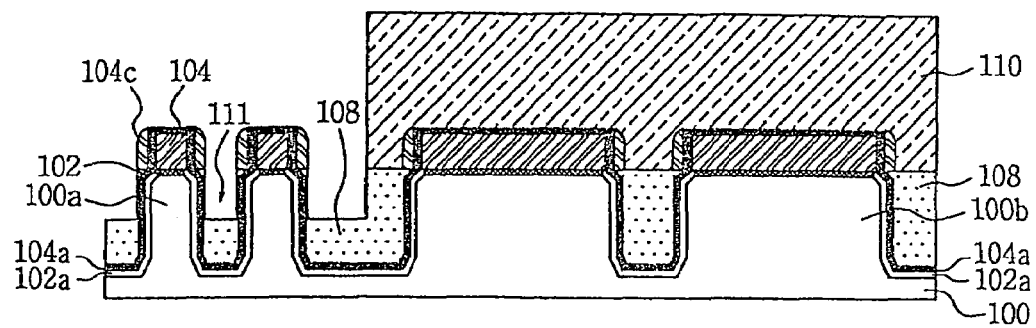
Figure 12B:
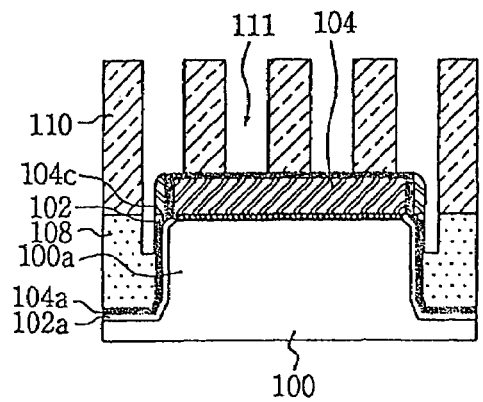
Figure 12C:
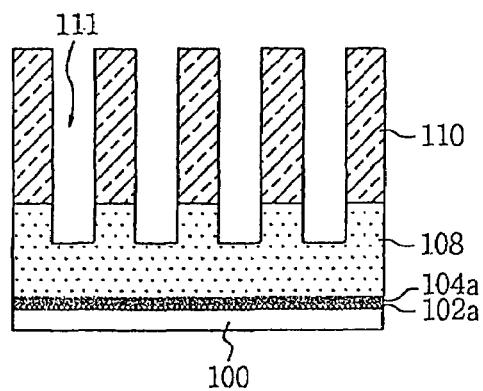

With reference to FIGS. 12a to 12c, a second photoresist pattern 110 is formed on the semiconductor substrate to expose the portions of the cell area where the gate electrodes 112a will be formed. In other words, the second photoresist pattern 110 is disposed to cover the peripheral area and the portion of the cell area where the gate electrodes are not formed.

The device isolation film 108 is anisotropically etched by using the second photoresist pattern 110, the mask pattern 104, and the spacer 104c as an etch mask, thus forming an opening part 111 in the cell area. The anisotropic etching process may employ an etching method such as a dry etching or a plasma etching. The opening part 111 is formed with a predetermined depth, exposing the nitride layer liner 104a formed on the sidewalls of the active region that corresponds to a portion where the gate electrodes 112a of the cell area will be formed. The opening part 111 is formed to a depth of about 1000 to 1500 Å from an upper part of the active region.

The spacer 104c protects an upper edge portion of the active region 100a and 100b in etching the device isolation film 108.

Figure 13A:
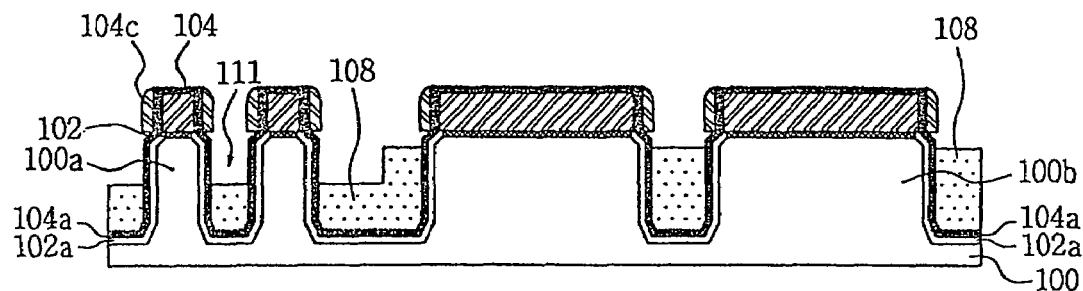
Figure 13B:
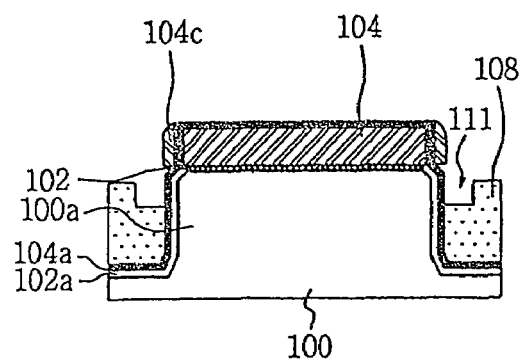
Figure 13C:
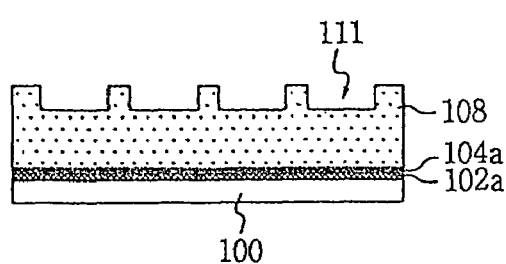

As shown in FIGS. 13a to 13c, the second photoresist pattern 110 is removed. Next, an isotropic etching process is performed to remove portions of the device isolation film 108 from the cell area and from the peripheral area, using the mask pattern 104 and the spacer 104c as an etch mask. Thereby, a portion of the device isolation film 108 existing between the nitride layer liner 104a corresponding to the upper edge portion of active regions 100a and 100b and the spacer 104c is removed.

Such a process prevents particle generation caused by the subsequent removal process for the mask pattern 104 and the spacer 104c.

Figure 14A:
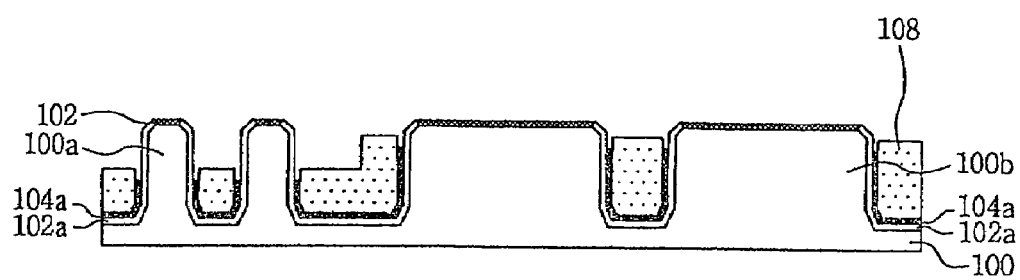
Figure 14B:
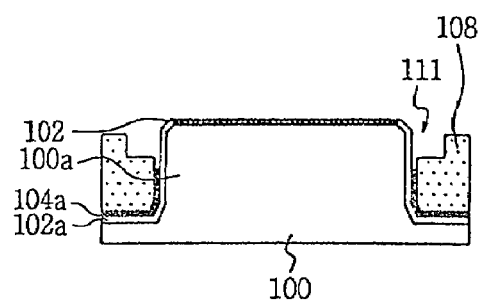
Figure 14C:
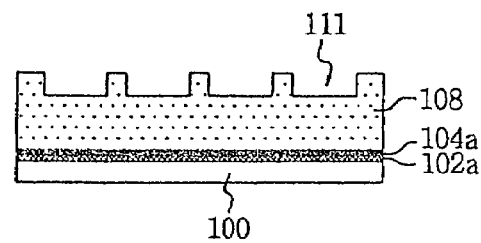

In FIGS. 14a to 14c, the mask pattern 104 and the spacer 104c are removed, a portion of the nitride layer 104a exposed in the opening part 111 is removed, and a portion of the nitride layer 104a exposed in the peripheral area by the edge portion of active region 100b is removed. Thus, an upper portion of the active region is exposed under a formed state of the first oxide layer 102, and the edge portion of active region and a portion of sidewalls are exposed under a formed state of the third oxide layer 102a. Herewith, the first oxide layer 102 and the third oxide layer 102a formed on an upper part of the active region 100a and 100b and on a portion of the sidewalls function as a gate insulation layer.

In subsequent processes, the following processes may be added. That is, the first oxide layer 102 and the third oxide layer 102a, which are formed on the upper edge portion of active region including the cell area and the peripheral area and in partial sidewalls, are removed, and then a fourth oxide layer (not shown) is formed with about 70 Å. The fourth oxide layer is formed to function as a gate insulation layer, because the first oxide layer 102 and the third oxide layer 102a may be damaged during the above-described processes, causing some trouble for a normal operation as the gate insulation layer.

Figure 15A:
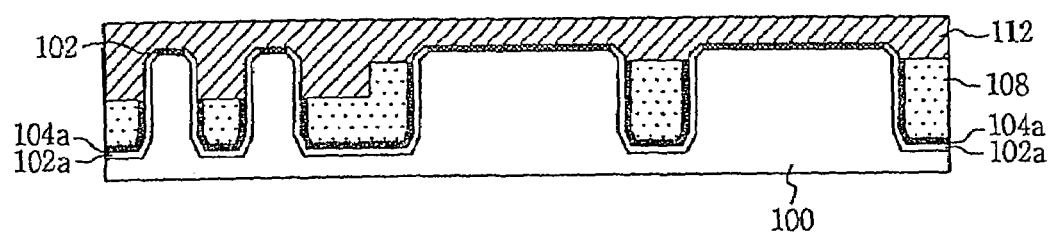
Figure 15B:
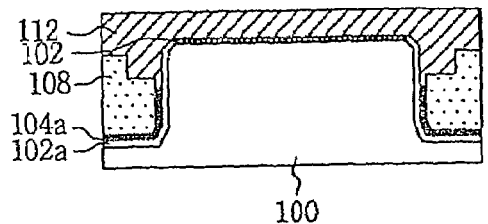
Figure 15C:
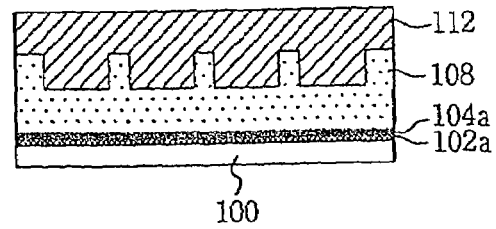

In FIGS. 15a to 15c, a conductive layer 112 is formed on the semiconductor substrate where the gate insulation layer was formed. The conductive layer 112 is formed enough to sufficiently fill the opening part 111 and cover an upper part of the active regions 100a and 100b. The conductive layer 112 is preferably formed to a thickness of about 800 Å on the upper part of the active regions. The conductive layer 112 may be formed of polysilicon material, or it may be formed of a metal layer or some other conductive material.

In FIGS. 16a to 16c, a metal silicide layer 114 is formed over the semiconductor substrate where the conductive layer 112 was formed. The metal silicide layer 114 is preferably formed to a thickness of about 1000 Å and may be, for example, tungsten silicide. Next, an insulation layer 116 that functions as a gate capping layer may be formed over the semiconductor substrate where the metal silicide layer 114 was formed. The insulation layer 116 is preferably formed to a thickness of about 2000 Å and may be, for example, formed of a nitride layer material.

In FIGS. 17a to 17c, on the semiconductor substrate on which the conductive layer 112, the metal silicide layer 114, and the insulation layer 116 as the capping layer were formed, a third photoresist pattern (not shown) for forming a gate is formed. Then, an anisotropic etching process is progressed by using the third photoresist pattern as an etching mask, to form a gate capping layer 116a. Subsequently, the third photoresist pattern is removed through an ashing or stripping process, and the metal silicide layer 114 and the conductive layer 112 are anisotropically etched by using the gate capping layer 116a as an etch mask and the device isolation film 108 as an etching stop layer, to thus form a gate electrode 112a that includes a metal silicide layer 114a.

The gate electrode 112a and the gate capping layer 116a may alternatively be formed by sequentially anisotropic etching the insulation layer 116 as the gate capping layer, the metal silicide layer 114 and the conductive layer 112, by using the third photoresist pattern as an etch mask and the device isolation film 108 as the etching stop layer.

Figure 18:
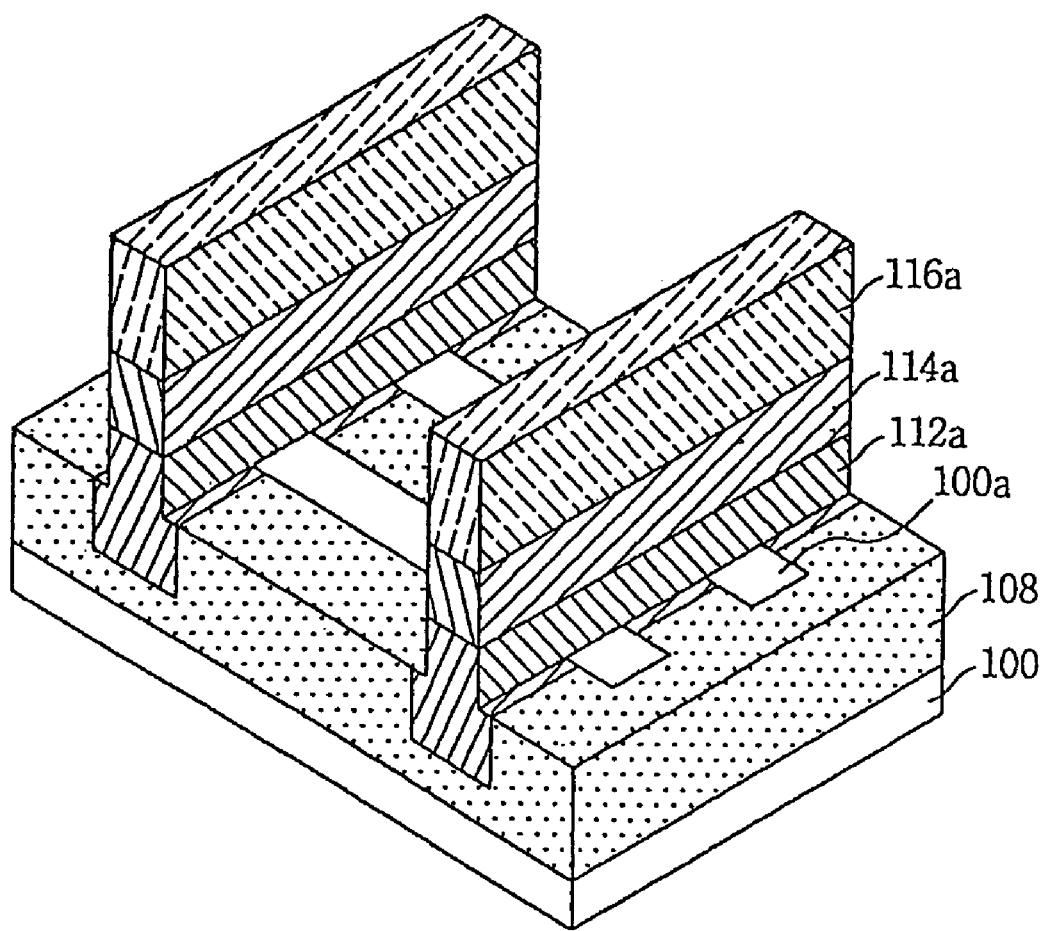
FIG. 18 is a perspective diagram illustrating completed finFETs according to some embodiments of the invention.

FIG. 18 is a perspective diagram illustrating completed finFETs according to the embodiments of the invention described above.

Referring to FIG. 18, the device isolation film 108 surrounds the active region 100a formed on the semiconductor substrate 100. The conductive layer 112 fills the opening part formed on the device isolation film 108, and the gate electrode 112a is formed in contact with a portion of sidewalls of the active region 100a and covering an upper portion of the active region 100a. The metal silicide layer 114a and the gate capping layer 116a are formed on an upper part of the gate electrode 112a.

In the exemplary processes for forming the gate electrode described above, the device isolation film 108 has a height that is equal to an upper part of the fin type active regions 100a and 100b, and a damascene method is employed, like forming the opening part 111 in the device isolation film 108 and filling the opening part 111 with the conductive layer 112, etc. Thus, in the etching process to form the gate electrode 112a, an etch amount is small, and also in etching the conductive layer 112 only till an upper part of the active region, a separation of gate electrode is easy and an etching byproduct is small.

The finFET is completed by forming source and drain regions through an ion implantation under interposing the gate electrode 112a therebetween on the remaining portion of active region where the gate electrode 112a and the gate capping layer 116a are not formed.

Though the finFET formed through the above processes may be desirably applied to a DRAM (Dynamic Random Access Memory) cell, it goes without saying that this is applicable to a formation of other memory devices such as a SRAM, etc.

As described above, according to embodiments of the invention, a method of forming a finFET prevents or substantially reduces problems such as a concentration of electric field or a leakage current, by rounding an upper edge portion of the fin type active region. The formation of a gate electrode using a damascene method provides process simplification, makes separation of the gate electrode easier, and prevents or reduces a short of the gate electrode. In addition, in the etching process for separating the gate electrode, the etching amount is effectively reduced, lessening problems caused by too much etching by-product.

Embodiments of the invention may be practiced in many ways. What follows are exemplary, non-limiting descriptions of some of these embodiments.

According to an example embodiment of the invention, a method of forming a finFET includes forming an active region of fin type under an exposure state of sidewalls on a semiconductor substrate; forming a gate insulation layer on an upper part of the active region and in the sidewalls, and then forming a device isolation film surrounding the active region by an upper height of the active region, and forming an opening part for partially exposing the sidewalls on the device isolation film; forming a gate electrode by filling the opening part with conductive layer with covering an upper portion of the active region; and forming source and drain between which the gate electrode is formed, on a portion where the gate electrode of active region is not formed.

According to another example embodiment of the invention, a method of forming a finFET includes forming an active region of fin type under an exposure state f sidewalls on a semiconductor substrate, and forming a device isolation film surrounding the active region by an upper height of the active region; forming an opening part for partially exposing the sidewalls of active region on a portion of the device isolation film; interposing a gate insulation layer in a portion of sidewalls exposed by the opening part and in an upper portion of the active region, and thus forming a gate electrode that fills the opening part and also covers an upper portion of the active region; and forming source and drain between which the gate electrode is formed, on a portion where the gate electrode is not formed in the active region.

Herewith, the active region is obtained by rounding an upper edge portion thereof, and it may be desirable to obtain the rounded edge portion of the active region through an oxide layer forming process using ISSG.

According to another example embodiment of the invention, a method of forming a finFET includes the following processes.

A mask pattern of laminated structure having a first oxide layer and a first insulation layer of nitride layer material is formed by a first photoresist pattern to form a fin-type active region on a face of a bulk semiconductor substrate.

A second oxide layer is formed through an ISSG process on a side face and an upper part of the semiconductor substrate and the mask pattern, thereby forming a rounded portion between the semiconductor substrate and a side face of the mask pattern.

The second oxide layer, except for the portion formed on the side face of the mask pattern, is removed. Then the semiconductor substrate is etched by using the mask pattern and the second oxide layer provided in the side face of the mask pattern as an mask, to thus form a fin-type active region.

A rounded edge portion formed from the upper part of active region is exposed by removing the second oxide layer formed on the side face of mask pattern, and a third oxide layer is formed on an exposed portion of the semiconductor substrate including the active region. A nitride layer liner is formed on a face of semiconductor substrate where the third oxide layer was formed.

A device isolating insulation layer fills a face of the semiconductor substrate where the nitride layer liner was formed. An isolation layer is formed by performing a planarization process through use of the mask pattern as a planarization stop layer.

The device isolation film is etched back until an upper part of the active region is exposed by using the mask pattern as an etch mask.

A second insulation layer of nitride layer material is formed with a predetermined thickness on a face of the semiconductor substrate, and is then etched back to expose an upper part of the device isolation film, thus forming a nitride layer spacer on a sidewall of the mask pattern.

An opening part for partially exposing sidewalls of the active region is formed by etching the device isolation film to a predetermined depth by using a second photoresist pattern and the nitride layer spacer as a mask, the second photoresist pattern being for exposing only a portion where a gate of the cell area will be formed.

The second photoresist pattern is removed, and an isotropic etching process is performed by using the nitride layer spacer as a mask, to remove a portion of the device isolation film formed between the nitride layer liner and the upper edge of active region.

The mask pattern from an upper part of the active region, the nitride layer spacer, and the nitride layer liner of the exposed sidewall are removed.

A polysilicon layer as a conductive layer having a given thickness is formed, filling the opening part, on a face of the semiconductor substrate from which the nitride layer liner was removed. Subsequently, a tungsten silicide layer and a nitride layer as a capping layer are sequentially formed on the conductive layer.

The nitride layer as the capping layer, the tungsten silicide layer, and the polysilicon layer are sequentially etched by a third photoresist pattern until the device isolation film is exposed, to form a gate electrode and a gate capping layer.

Source and drain regions between which the gate electrode is formed, are formed on a portion of active region where the gate electrode is not formed.

The method of forming the finFET may further include, removing the first oxide layer and the third oxide layer, which are formed on an upper part of the exposed active region and in the exposed sidewalls, to thus expose an upper part of active region and a portion of the sidewalls, after removing the mask pattern from the upper part of active region, the nitride layer spacer and the nitride layer liner of exposed sidewall; and forming a gate insulation layer on an upper part of the exposed active region and in a portion of the sidewalls.

The method simplifies the separation of the gate electrode, substantially reduces problems caused by etching byproduct, prevents leakage current in the channel region, and prevents excessive electric field concentration onto an edge part of the active region.

It will be apparent to those skilled in the art that modifications and variations can be made to the exemplary embodiments of the invention described above without deviating from the spirit or scope of the invention. Thus, it is intended that the invention cover any such modifications and variations of this invention provided they come within the scope of the appended claims and their equivalents. For instance, a shape of the substrate, the gate electrode or fin, and a configuration of layer material, may be changed, and manufacturing processes may be added or reduced. Accordingly, these and other changes and modifications are seen to be within the true spirit and scope of the invention as defined by the appended claims.

We claim:

1. A method of forming a finFET, comprising:
   forming a fin type active region on a semiconductor substrate;
   depositing a gate insulation layer on an upper part of the fin type active region and on a sidewall of the fin type active region;
   forming a device isolation film surrounding the active region by an upper height of the active region;
   forming an opening part for partially exposing the sidewalls on the fin type active region by etching a portion of the device isolation film;
   filling the opening part with a conductive layer to form a gate electrode; and
   forming a source and a drain between which the gate electrode is formed, on a portion of the fin type active region where the gate electrode is not formed.

2. The method of claim 1, wherein forming the fin type active region comprises etching a bulk semiconductor substrate.

3. The method of claim 2, wherein forming the fin type active region comprises rounding off an upper corner of the fin type active region where an upper surface of the fin type active region meets the sidewall of the fin type active region.

4. The method of claim 3, wherein rounding an upper corner portion of the fin type active region comprises forming an oxide layer with an in-situ steam generation method.

5. The method of claim 3, further comprising:
   before forming the fin type active region, sequentially depositing a first oxide layer and a first insulation layer on the semiconductor substrate;
   forming a first photoresist pattern on the first insulation layer;
   forming a mask pattern that exposes a first portion of the semiconductor substrate by using the first photoresist pattern;
   forming a second oxide layer on the first portion of the semiconductor substrate and on a side face and an upper part of the mask pattern;
   rounding a second portion of the semiconductor substrate between the first portion of the semiconductor substrate and the side face of the mask pattern;
   removing the second oxide layer from the upper part of the mask pattern and the first portion of the semiconductor substrate; and
   anisotropically etching the semiconductor substrate using the mask pattern and the second oxide layer on the side face of the mask pattern as a mask.

6. The method of claim 5, wherein forming the second oxide layer comprises forming the second oxide layer with a in-situ steam generation method.

7. The method of claim 6, wherein forming the fin type active region comprises forming the fin type active region to a thickness of about 2000 Å to 3000 Å.

8. The method of claim 7, wherein the gate insulation layer comprises the first oxide layer formed on an upper part of the fin type active region and a third oxide layer formed on the sidewall of the fin type active region.

9. The method of claim 8, further comprising forming the gate electrode within the opening part, wherein forming the opening part comprises forming the opening part to a depth of about 1000 Å to 1500 Å in the upper part of the fin type active region.

10. The method of claim 9, wherein forming the gate electrode comprises forming the gate electrode of polysilicon material.

11. The method of claim 9, further comprising depositing a metal silicide layer within the opening part on an upper part of the gate electrode.

12. The method of claim 11, wherein the transistor is applied to a DRAM (Dynamic Random Access Memory) cell.

13. A method of forming a finFET comprising:
   etching a trench into a semiconductor substrate to form a fin type active region;
   filling the trench with a device isolation film, an upper surface of the device isolation film coplanar with an upper surface of the fin type active region;
   etching a portion of the device isolation film to form an opening part that partially exposes a sidewall of the fin type active region;
   filling the opening part with a conductive layer that also covers an upper portion of the fin-type active region to form a gate electrode; and
   implanting impurity ions in a portion of the fin type active region that is not covered by the gate electrode to form a source region and a drain region.

14. The method of claim 13, wherein etching a trench into the semiconductor substrate comprises etching the trench into a bulk semiconductor substrate.

15. The method of claim 14, wherein etching the trench into the bulk semiconductor substrate further comprises rounding an upper corner of the bulk semiconductor substrate where an uppermost surface of the bulk semiconductor substrate meets a substantially vertical surface of the bulk semiconductor substrate that is defined by the trench.

16. The method of claim 15, wherein rounding the upper corner comprises performing an in-situ steam generation process.

17. The method of claim 14, further comprising, before filling the trench with the device isolation film:
   sequentially forming a first oxide layer and a first insulation layer on a face of the bulk semiconductor substrate, and then forming a mask pattern for exposing a portion of the bulk semiconductor substrate by using a first photoresist pattern formed on the first insulation layer;
   forming a second oxide layer on the exposed portion of the bulk semiconductor substrate and on a side face and an upper part of the mask pattern, and rounding a portion of the bulk semiconductor substrate between the exposed portion of the bulk semiconductor substrate and the side face of the mask pattern;
   removing the second oxide layer from the upper part of the mask pattern and the bulk semiconductor substrate, but not from the side face of the mask pattern;
   etching the bulk semiconductor substrate by using the mask pattern and the second oxide layer on the side face of the mask pattern as an etch mask to form the fin type active region;
   removing the second oxide layer formed on the side face of the mask pattern to expose the rounded edge portion;
   forming a third oxide layer connected to the first oxide layer on the exposed portion of the bulk semiconductor substrate including the active region;
   forming a nitride layer liner on the third oxide layer; and depositing a device isolating insulation layer on a face of the bulk semiconductor substrate where the nitride layer liner was formed, and then planarizing the device isolating insulation layer using the mask pattern as a stop layer.

18. The method of claim 17, wherein forming the second oxide layer comprises forming the second oxide layer with a in-situ steam generation process.

19. The method of claim 13, wherein etching the trench to form the fin type active region comprises forming the fin type active region to a thickness of about 2000 Å to 3000 Å.

20. The method of claim 17, further comprising, after removing the first and third oxide layers but before filling the opening part with the conductive layer, partially filling the opening part with a fourth oxide layer that is formed on the upper part of the fin type active region and on a portion of the sidewall of the fin type active region.

21. The method of claim 20, wherein etching the portion of the device isolation film to form the opening part comprises etching the portion of the device isolation film to a depth of about 1000 Å to about 1500 Å from an upper part of the fin type active region.

22. The method of claim 21, wherein filling the opening part with the conductive layer to form the gate electrode comprises filling the opening part with a polysilicon material.

23. The method of claim 22, further comprising depositing a tungsten silicide layer on the polysilicon material.

24. The method of claim 23, wherein the finFET is applied to a DRAM cell.

25. A method of forming a finFET, comprising:
depositing a first oxide layer and a first insulation layer on a face of a bulk semiconductor substrate, the first insulation layer consisting of a nitride material;
depositing a first photoresist pattern on the first insulation layer;
using the first photoresist pattern to form a mask pattern having a laminated structure, the laminated structure including the first oxide layer and the first insulation layer;
using the mask pattern to form an active region on the face of the bulk semiconductor substrate;
forming a second oxide layer on a side face and an upper part of the semiconductor substrate and the mask pattern with an in-situ steam generating process;
rounding a portion of the active region between the semiconductor substrate and a side face of the mask pattern;
removing the second oxide layer from the upper part of the mask pattern and the semiconductor substrate but not from the side face of the mask pattern;
etching the semiconductor substrate by using the mask pattern and the second oxide layer on the side face of the mask pattern as an mask, thus forming a fin type active region;
exposing the rounded portion of the active region by removing the second oxide layer from the side face of mask pattern;
forming a third oxide layer on an exposed portion of the semiconductor substrate including the active region;
forming a nitride layer liner on a face of the semiconductor substrate where the third oxide layer was formed;

depositing a device isolating insulation layer on a face of the semiconductor substrate where the nitride layer liner was formed;
planarizing the device isolating insulation layer using the mask pattern as a polarization stop layer to form a device isolation film;
etching the device isolation film until it reaches an upper height of the active region by using the mask pattern as an etch mask;
forming a second insulation layer of nitride layer material to a predetermined thickness on a face of the semiconductor substrate;
etching the second insulation layer to expose an upper part of the device isolation film and to form a nitride layer spacer on a sidewall of the mask pattern;
etching the device isolation film to a predetermined depth by using a second photoresist pattern and the nitride layer spacer as a mask to form an opening part that exposes a portion of sidewalls of the active region, the second photoresist pattern exposing only a portion of the active region where a gate of a cell area will be formed;
removing the second photoresist pattern;
isotropically etching away a portion of the device isolation film formed between the nitride layer liner and the upper edge of active region using the nitride layer spacer as a mask;
removing the nitride layer spacer from the sidewall of the mask pattern, the mask pattern from an upper part of the active region, and the nitride layer liner from the exposed sidewall;
filling the opening part with a conductive layer having a predetermined thickness on a face of the semiconductor substrate where the nitride layer liner was removed, the conductive layer consisting of a polysilicon layer;
sequentially forming a tungsten silicide layer and a capping layer on the conductive layer, the capping layer consisting of a nitride layer;
sequentially etching the capping layer, the tungsten silicide layer, and the polysilicon layer by using a third photoresist pattern until the device isolation film is exposed, thus forming a gate electrode and a gate capping layer; and
forming a source region and a drain region to either side of the gate electrode, on a portion of the active region where the gate electrode is not formed.

26. The method of claim 25, further comprising:
after removing the nitride layer spacer from the sidewall of the mask pattern, the mask pattern from an upper part of the active region, and the nitride layer liner from the exposed sidewall, removing the first oxide layer and the third oxide layer, which are formed on an upper part of the exposed active region and on the exposed sidewalls, to expose an upper part of the active region and a portion of the sidewalls; and
forming a gate insulation layer on the upper part of the exposed active region and on the portion of the sidewalls.

* * * * *